United States Patent [19]

Kurihara et al.

[11] Patent Number: 4,556,899

[45] Date of Patent: Dec. 3, 1985

[54] INSULATED TYPE SEMICONDUCTOR DEVICES

[75] Inventors: Yasutoshi Kurihara, Katsuta; Yoshihiro Suzuki, Hitachi; Michio Ooue, Hitachi; Hiroaki Hachino, Hitachi; Mitsuo Yanagi, Hitachi, all of Japan

[73] Assignee: Hitachi, Ltd., Tokyo, Japan

[21] Appl. No.: 386,071

[22] Filed: Jun. 7, 1982

[30] Foreign Application Priority Data

Jun. 5, 1981 [JP] Japan ................... 56-85741

[51] Int. Cl.$^4$ ............ H01L 23/14; H01L 23/36; H01L 23/54
[52] U.S. Cl. .................... 357/80; 357/71; 357/67; 357/81
[58] Field of Search .............. 357/67, 65, 71, 80, 357/81

[56] References Cited

U.S. PATENT DOCUMENTS

| 3,248,681 | 4/1966 | Reintgen | 357/67 X |
| 3,311,798 | 3/1967 | Gray | 357/81 |
| 3,597,658 | 8/1971 | Rivera | 357/81 |
| 3,829,598 | 8/1974 | Darnell | 357/72 |
| 4,025,997 | 5/1977 | Gernitis et al. | 357/81 |
| 4,227,036 | 10/1980 | Fitzgerald | 357/81 |
| 4,278,990 | 7/1981 | Fichot | 357/80 X |
| 4,340,902 | 7/1982 | Honda et al. | 357/81 |

FOREIGN PATENT DOCUMENTS 89664 8/1978 Japan ................... 357/81

Primary Examiner—Andrew J. James
Assistant Examiner—Sheila V. Clark
Attorney, Agent, or Firm—Antonelli, Terry & Wands

[57] ABSTRACT

In an insulated type semiconductor device, a metal member is disposed between an insulating member and a circuit element which includes a semiconductor substrate. The metal member is a composite metal member having at least two different kinds of metal layers bonded to each other. In a preferred embodiment, in order to reduce undesirable effects caused by differences in the thermal coefficients $\alpha_I$ and $\alpha_S$ of the insulating member and the semiconductor substrate, respectively, the thermal expansion coefficient of said composite metal member as a whole $\alpha_M$ is adjusted in a range between $\alpha_I$ and $\alpha_S$.

12 Claims, 7 Drawing Figures

INSULATED TYPE SEMICONDUCTOR DEVICES

BACKGROUND OF THE INVENTION

The present invention relates to a semiconductor device of a type having a supporting member for a semiconductor substrate in an electrically isolated manner therebetween.

Many kinds of semiconductor devices have supporting members not only for supporting the semiconductor substrate, but also to serve as an external electrode. One particular type of semiconductor device has been proposed in which the supporting member is electrically isolated from all the electrodes formed on the semiconductor substrate mainly for improving their adaptability in an electrical circuit. Such a semiconductor device will be referred to as a semiconductor device of the insulated type, or, more simply, as an insulated device in this specification. Hybrid ICs or semiconductor module devices are examples of such insulated devices. A discussion of such insulated devices can be found in U.S. Pat. No. 3,469,148.

On the other hand, it is required for a semiconductor device to dissipate heat generated in the semiconductor substrate while it operates through a support member for a safe and stable operation of the device. The heat flows from the semiconductor substrate to the atmosphere through various members therebetween. The semiconductor device of the insulated type is characterized by including an electrically insulating member in the path of the heat.

Some problems are found in semiconductor devices of the insulated type. These problems are, for example, poor conductivity of heat in the insulating layer, and large differences in the thermal expansion coefficients between the insulating layer and other members bonded thereto.

SUMMARY OF THE INVENTION

An object of the invention is to provide a semiconductor device of the insulated type having thermally, electrically and mechanically improved characteristics.

To this end the present invention proposes a stacked structure of an insulating member, a metal member and a heat generating circuit element. An inorganic material such as alumina ($Al_2O_3$) is preferably used as the insulating member. For the metal member, the present invention proposes to utilize a composite structure of metal members including a metal layer bonded with another kind of metal layer, which structure will be referred to as a composite metal member. The heat generating circuit element is generally the semiconductor substrate, or, in an application of a hybrid IC or a semiconductor module device, other kinds of circuit elements such as resistors.

The members for the stacked structure are bonded by solder with each other. In the structure mentioned above, the thermal expansion coefficient of the composite metal member as a whole ($\alpha_M$) is adjusted to a value within a range between that of the insulating member ($\alpha_I$) and that of the semiconductor substrate ($\alpha_S$)

In a semiconductor device of the insulated type, an inorganic material such as ceramics is preferably used for the insulating member since it must be able to withstand a large amount of heat generated by the device, and since it must have high reliability and stability against moisture or heat from the atmosphere. For the same requirements, a metal solder is preferably used to bond the insulating member with another member adjacent thereto. The semiconductor substrate is usually bonded with the insulating member via a metal layer interposed therebetween rather than by direct bonding. The interposed metal layer is, on the one hand, for an electrically conducting path from the circuit to the semiconductor substrate, and, on the other hand, for a means for spreading and conducting heat generated in the semiconductor substrate effectively to the insulating layer.

For an effective conducting of heat and electricity, Cu, for example, is generally preferable for the interposed metal layer. But there might be a large difference in thermal expansion coefficient between the semiconductor substrate or insulating member and the interposed metal layer. For example, the thermal expansion coefficient of Si for the semiconductor substrate is $3.5 \times 10^{-6}/°C.$, that of $Al_2O_3$ is $6.3 \times 10^{-6}/°C.$, while that of Cu is $18 \times 10^{-6}/°C.$ A couple of problems are raised by such large differences in thermal expansion coefficients. The first problem occurs when the semiconductor device of the insulated type is produced, namely, when the semiconductor substrate and the insulating member whose surface is metallized are soldered to the interposed metal layer. During such soldering, after stacking the insulating member, first solder sheet, interposed metal layer, second solder sheet and the semiconductor substrate, the stacked structure is heated to a temperature higher than the melting point of the solder. Then, the temperature of the stacked structure is lowered to allow the solder to solidify. Once the solder is solidified, the above-mentioned components are bonded firmly with each other. However, a further cooling of the stacked structure to a room temperature causes shrinkage of each components according to its own thermal expansion coefficient.

The large difference in the coefficient among the above-mentioned components, therefore, causes a large difference in the amount of shrinkage. This produces thermal stresses in the bonding interfaces. A small thermal stress might be absorbed in the solder layer which is the softest material in the structure. However, if the thermal stress is too large to be absorbed in the solder layer, a distortion occurs in the above-mentioned components. Especially in a large semiconductor module device, the distortion is more likely to occur for a large number of circuit elements are used and, consequently, a large area is required for the interposed metal layer and the insulating member while the thickness of these elements is relatively small.

The second problem can occur when such a device is being used in an intermittent manner. During such intermittent operations a great number of thermal cycles are applied to the device. When the device operates, the temperature goes up to about 100° to 150° C., while when the device is in its off state, the temperature goes down to room temperature.

During every thermal cycle, the components of the device experience the expansion and the shrinkage alternately according to their own thermal expansion coefficient. The difference in the degree of expansion and shrinkage mostly affects the solder layer. In particular, a thermal fatigue phenomenon takes place in the solder layer after a large number of thermal cycles. Consequently the solder becomes frail and, eventually, cracks are introduced in the solder layer. This results in deterioration of bonding strength and the conductivities of electricity and heat. The cracks are in many cases observed in the peripheral portions of the solder layer. Incidentally, since the area of the major surface of the insulating layer in the insulated device is generally larger than the area required for the semiconductor substrate to be bonded in order to provide safe insulation, the above-mentioned problems are likely to take place.

According to the present invention, preferably the laminated structure of metal sheets, that is, the composite metal layer, is utilized for the interposed metal layer which works as a current path to the semiconductor substrate, a heat path from the semiconductor substrate to the support member via the insulating member as well as a heat spreading means for the heat generated in the semiconductor substrate which is rather small in area to spread out. The thermal expansion coefficient of the composite metal layer is considered that which is apparent as a whole. For example, for the composite structure consisting of "n" layers of different sheets, the apparent thermal expansion coefficient ($\alpha_M$) is approximately given as:

$$\alpha_M = \frac{\sum\limits_{i=1}^{n} E_i t_i \alpha_i}{\sum\limits_{i=1}^{n} E_i t_i}$$

where $\alpha_i$ is a thermal expansion coefficient, $E_i$ is an elastic coefficient, and $t_i$ is a thickness of i-th sheet respectively. The present invention proposes to adjust $\alpha_M$ to a value within a range between the thermal expansion coefficient $\alpha_I$ for the insulating member and the thermal expansion coefficient $\alpha_S$ for the semiconductor substrate for solving the above-described problems. Applicants' experiments have shown this to be especially significant with regard to the aforementioned second problem concerning intermittent operation.

DESCRIPTION OF PREFERRED EMBODIMENTS

Figure 1:
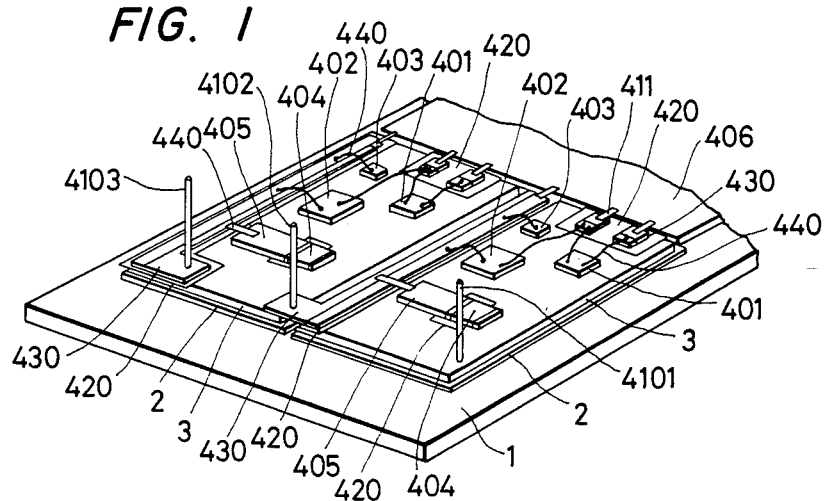
FIG. 1 is a perspective view showing a part of a semiconductor module device which is an embodiment of the present invention.
Figure 2:
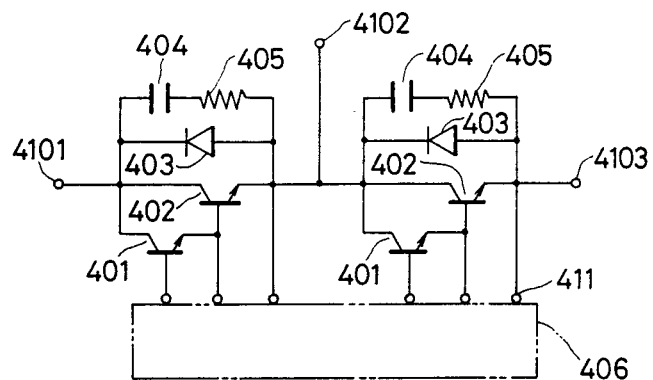
FIG. 2 shows a part of an electrical circuit corresponding to the device as shown in FIG. 1.

Referring now to the drawings, a preferred embodiment will be explained. In FIG. 1, which is a perspective view showing a part of a 1.5 kVA class power module device, two alumina (Al$_2$O$_3$) plates 2 are bonded on a metal support 1. On each of alumina plates 2, a composite metal plate 3 is soldered (solder not shown). A circuit as shown in FIG. 2 is then actualized on the composite metal plate 3. In the figures, transistor 401, 402 and diode 403 are directly soldered on the composite metal plate 3. 404 denotes a capacitor, and 405 denotes a resistor. These circuit elements are connected electrically to make the circuit shown in FIG. 2 by means of wiring and, conductor means 430 and 440. Terminals 4101, 4102 and 4103 are provided for external connections. Terminal 4101 is directly bonded on the composite metal plate 3, terminal 4102 is bonded via conductor means 430, and terminal 4103 is bonded via conductor means 430 on an insulator film 420. 406 denotes a conventional driver circuit means which is not actually shown in the figures. 411 denotes a connection to the driver circuit.

Figure 3:
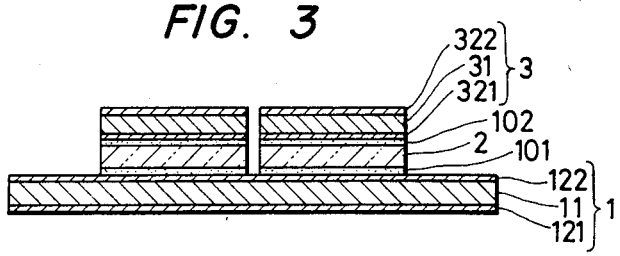
FIG. 3 is a cross-sectional view showing the stacked structure for supporting the electrical circuit elements utilized in the device as shown in FIG. 1.

FIG. 3 is a cross-sectional view of a portion of FIG. 1 showing the device from the metal support 1 to the composite metal plate 3. A detailed cross section of the semiconductor circuit elements themselves has been omitted for clarity in explaining the significance of the elements 1, 2 and 3. It should be noted that FIG. 3 is somewhat schematic in nature and not drawn to scale.

In FIG. 3 metal support 1 consists of a center layer 11 of Cu with a thickness of 1.5 mm and two outer layers 121 and 122 of Fe-36 wt. % Ni alloy with a thickness of 0.5 mm each. These outer layers 121 and 122 are bonded directly to the center layer 11 by a cold rolling process. The metal support 1 has an area defined by a 61 mm width and a 105 mm length in its plan view and an apparent thermal expansion coefficient of about $6.8 \times 10^{-6}/°$C., which approaches that of sintered alumina ($6.3 \times 10^{-6}/°$C.).

On one of a pair of major surfaces of the metal support 1, two sintered alumina plates 2 are soldered by solder layers 101 having a thickness of 0.1 mm, which solder consists of Pb-60 wt. % Sn alloy. The bonding areas of the alumina plates 2 are treated by Ni plating so as to improve the wettability to the solder. Each alumina plate 2 has dimensions of a 28 mm width, a 33 mm length and a 0.25 mm thickness.

A composite metal plate 3 is soldered on each alumina plate 2 by a solder layer 102 which has the same components and thickness as the solder layer 101. The composite metal plate 3 consists of a center layer 31 of Cu having a thickness of 0.2 mm and a pair of outer layers 321 and 322 made of Fe-36 wt. % Ni alloy. Each of the outer layers 321 and 322 has a thickness of 0.2 mm. These outer layers are bonded directly to the center layer by a cold rolling process. The composite support 3 has an area defined by a 25 mm width and a 30 mm length in its plan view and a thermal expansion coefficient of about $6.0 \times 10^{-6}/°$C. which lies between that of alumina ($6.3 \times 10^{-6}/°$C.) and Si ($3.5 \times 10^{-6}/°$C.) In this embodiment, the center layer has higher electrical and thermal conductivities than the outer layers.

The coefficient of thermal expansion of the composite metal plate can be adjusted by modifying the kind of the metal, the composition of the alloy or the grade of rolling if bonding is done by a rolling process. For example, the thermal expansion coefficient of 54 wt. % Fe-29 wt. % Ni-17 wt. % Co alloy is converted from $5.5 \times 10^{-6}/°$C. to $5 \times 10^{-6}/°$C. after rolling in which 60% of the thickness is reduced, or to $6 \times 10^{-6}/°$C. after rolling in which 90% of the thickness is reduced.

Figure 4:
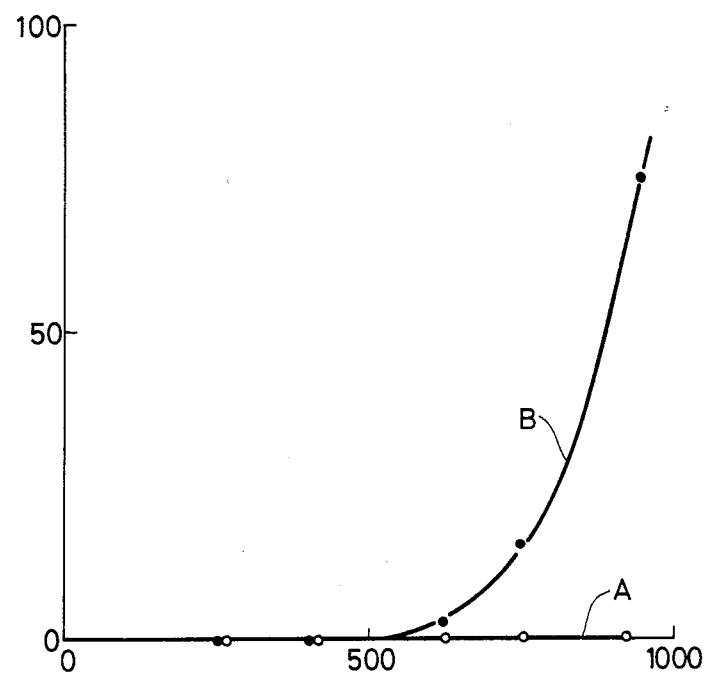
FIG. 4 is a graph showing the rates of damage occurrence in the device as shown in FIG. 1 (line A) and a comparison device (line B).

According to this embodiment, anti-thermal cycle characteristics are remarkably improved without deteriorating heat dissipating characteristics. This advantage becomes especially effective when the device has a large insulating layer, that is, a large bonding area. FIG. 4 represents the above-mentioned effect, in which curve A represents the embodiment of the invention and curve B represents a comparison device which has a 3 mm thick Cu plate instead of the composite metal plate 3. FIG. 4 shows a rate of damage occurrence (%) versus an area of an alumina insulating layer (mm$^2$) after 150 thermal cycles. One thermal cycle is a cycle of 5 min. at room temperature, 25 min. at $-55°$ C., 5 min. at room temperature, and 25 min. at 150° C. It is evident in FIG. 4 that there is no damage occurrence either in A or B when the area of alumina is up to about 500 mm$^2$. On the other hand, the damage occurrence goes up sharply in the comparison device, while the damage does not occur in the embodiment of the present invention, in the range where the area is larger than about 500 mm$^2$. It should be noted that for the test "damage" typically means cracks introduced in the solder layer which deteriorate thermal and electrical conductivities.

Further, in the range in which the area is less than about 500 mm$^2$, the embodiment of the present invention has a warpage of at most about 20 $\mu$m in the metal support. This is much smaller than the comparison device whose warpage was about 0.33 mm to 1.5 mm. A large warpage should be avoided, because such warping makes it difficult for the metal support to be attached securely onto an additional flange or an additional heat sink. According to the embodiment of the present invention, there is no substantial warping in the metal support so that the suitability for attachment to such additional elements is ensured.

Figure 5:
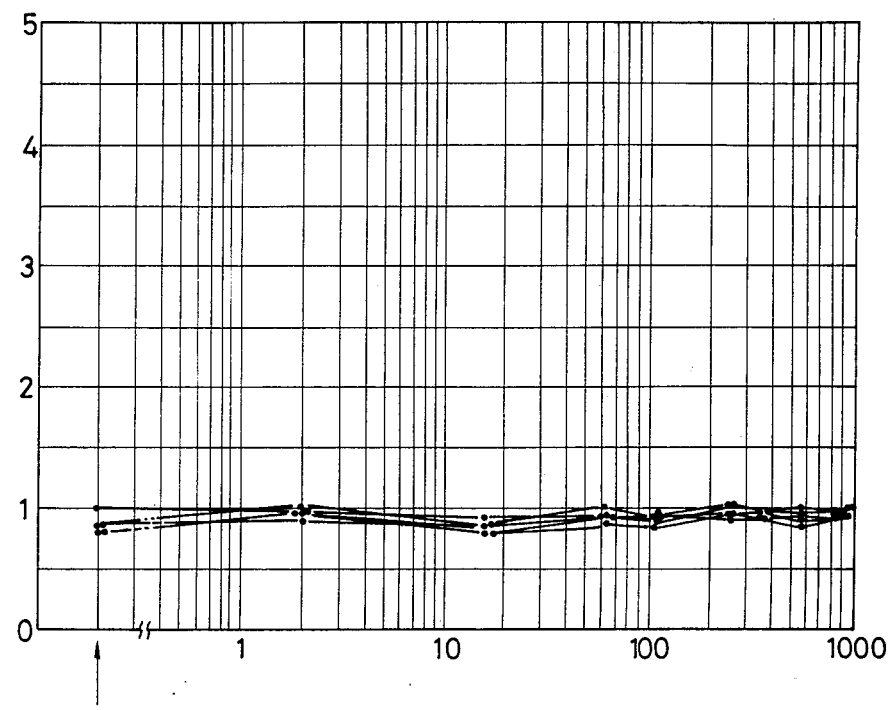
FIG. 5 is a graph showing the thermal resistance from the semiconductor substrate to the support member in the device as shown in FIG. 1.
Figure 6:
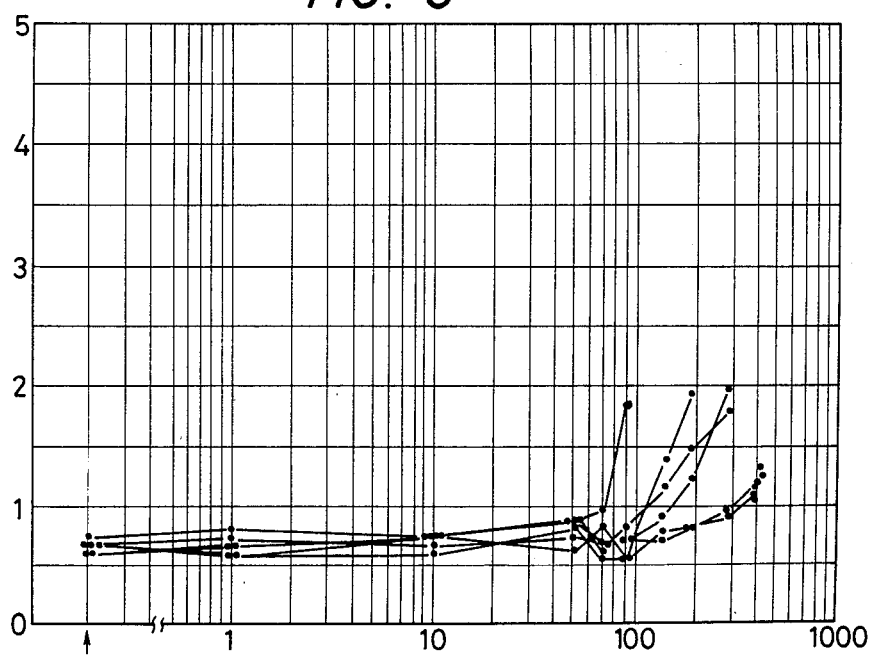
FIG. 6 is a graph showing the same quality as FIG. 5 in the comparison device.

FIG. 5 and FIG. 6 show other thermal characteristics, specifically thermal resistance from the semiconductor substrate to the metal support versus the number of the thermal cycles applied. FIG. 5 is for the embodiment of the present invention and FIG. 6 is for the aforementioned comparison device. In these cases, the thickness of composite metal plate 3 and the Cu substitute in the comparison device is adjusted to approximately 0.5 mm. Namely, the composite metal plate in the device in FIG. 5 has 0.37 mm thick Fe-36 wt. % Ni alloy center layer and two 0.07 mm thick Cu outer layers on a pair of major surfaces of the center layer respectively. It is evident from the figures that the thermal resistance does not increase even after 1,000 thermal cycles in the embodiment of the present invention (FIG. 5), while the thermal resistance goes up sharply after only 100 thermal cycles in the comparison device. The increase in the thermal resistance would typically be a result of cracks introduced in the solder layer.

In the above-described embodiment, the apparent thermal expansion coefficient of the composite metal plate 3 is preferably closer to that of the alumina plate 2 than to that of semiconductor substrate 1. Since the thermal stress is likely to increase in proportion to the area of soldering, it is effective for smaller thermal stress to adjust the thermal expansion coefficient of the c plate 3 within a range between the mid-point of $\alpha_S$ and $\alpha_I$, and $\alpha_I$.

Preferably the metal support 1 is made of the composite metal plate for a smaller thermal stress. However, this is not absolutely necessary for the present invention. Also it is preferable to attach Ni films by, for example, plating on the surfaces of metal support 1 and composite metal plate 3 for a better soldering. Alumina is preferable for the insulating member because it is easy to metalize its surface. Also, the rolling process is preferable to make the composite metal plate because in this process it is easy to adjust the thermal expansion coefficient. However, it should be noted that alternative materials and processes could be used, if desired.

Figure 7:
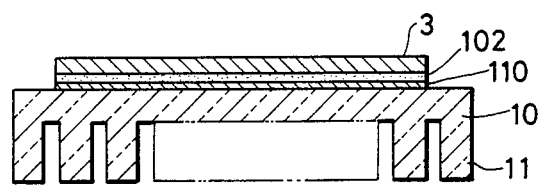
FIG. 7 is a cross-sectional view showing a part of another embodiment of the present invention.

Another embodiment is shown in FIG. 7, which utilizes a ceramic support 10. The bottom end portion of the ceramic support 10 has a large number of projections to serve as heat dissipating fins 11. On the upper surface of the ceramic support 10, a Ni film 110 is formed. On the Ni film 110, a composite metal plate 3 is bonded by a solder layer 102. The ceramic support 10 is made of sintered alumina and has a dimension of 25 mm width and 30 mm length. The solder layer 102 is made of Pb-5 wt. % Sn alloy and has a thickness of 0.1 mm. The composite metal plate 3 is made of a 0.1 mm thick Cu center layer clad with a 0.1 mm thick Fe-36 wt. % Ni alloy outer layers in both of the major surfaces of the center layer. Preferably, this composite metal plate is prepared by cold rolling and has a thermal expression coefficient of about $5 \times 10^{-6}/°$ C. According to the present embodiemnt, a simple structure for the device is attained since the ceramic support 10 is used both for a mechanical support and an insulating member.

Further modifications would be possible within the scope of the present invention. For example, for the insulating member, AlN, BN, SiC, Si$_3$N$_4$, BeO or any composite material thereof would be usable. For the composite metal plate, various compositions could be selected for the Fe-Ni or Fe-Ni-Co alloy. Cu could be substituted by Ni, Zn, Al, Au, Ag, Pd or any alloy made thereof. Otherwise, a stacked structure of Cu, Fe-Ni alloy and Cu could be usable as mentioned already in which the thermal and electrical conductivities in the outer layers are higher than those of the center layer. Of course, the number of the laminated or stacked layers is not limited to three. However, when two layer stacks are used, care should be taken to avoid the so-called bi-metal action since this can produce a large degree of warping. For example, in the device as shown in FIG. 1, if both the metal support 1 and the composite metal plate 3 are provided with a two layer stacks, they should be positioned to cancel the respective bi-metal action to each other.

It should also be noted that the composite metal plate could be made by a hot rolling process if desired. Further, the outer layers of the composite metal plate could be deposited onto the major surface(s) of center layer by plating, sputtering or a vapor deposition process. Also, the invention is not limited to only Pb-Sn soldering, and other systems of solder, for example Pb-Sn-Ag alloy, could be used for the solder layer. Further, it should be noted that all dimensions set forth in the specification are for purposes of example only, and different dimensions could, of course, be used within the scope of this invention.

It is to be understood that the above-identified arrangements are simply illustrative of the application of the principles of this invention. Numerous other arrangements may be readily devised by those skilled in the art which embody the principles of the invention and fall within its spirit and scope.

What is claimed is:

1. A semiconductor device comprising:

a support member;

an insulating member disposed on said support member;

a metal member soldered on said insulating member; and at least one circuit element including a semiconductor substrate soldered on said metal member, wherein the metal member is a composite metal member comprising at least two different kinds of metal layers bonded to each other, and wherein the thermal expansion coefficient of said composite metal member as a whole ($\alpha_M$) is adjusted in a range between the thermal expansion coefficient of the insulating member ($\alpha_I$) and that of the semiconductor substrate ($\alpha_S$) to reduce deterioration of the solder between the metal member and the insulating member and between the semiconductor substrate and the metal member during thermal cycles which occur in the semiconductor device during its operation.

2. A semiconductor device according to claim 1, wherein the insulating member has a larger major surface than that of the semiconductor substrate and the $\alpha_M$ is adjusted within a range between the $\alpha_I$ and the mid-point of $\alpha_S$ and $\alpha_I$.

3. A semiconductor device according to claim 2, wherein said composite metal member comprises a laminated structure of different kinds of metal sheets.

4. A semiconductor device according to claim 3, wherein said laminated structure comprises one center layer made of a first metal and two outer layers made of a second metal other than the first metal, which outer layers are clad on a pair of major surfaces of the center layer.

5. A semiconductor device according to claim 1, wherein said support member comprises a composite metal member having at least two different kinds of metal layers bonded to each other.

6. A semiconductor device according to claim 5, wherein said support member is a laminated structure of different kinds of metal sheets wherein said laminated structure comprises one center layer made of a first metal and two outer layers made of a second metal other than the first metal, which outer layers are clad on a pair of major surfaces of the center layer.

7. A semiconductor device according to claim 1, wherein the insulating member has an area greater than 500 mm$^2$.

8. A semiconductor device according to claim 7, wherein the insulating member comprises alumina.

9. A semiconductor device according to claim 4, wherein said center layer is comprised of copper and said outer layers are comprised of FeNi alloy.

10. A semiconductor device comprising:
an insulating support member having first and second major surfaces on opposite sides of said insulating support member;
a metal member soldered on the first major surface of said insulating support member; and
at least one circuit element including a semiconductor substrate soldered on said metal member,
wherein the metal member is a composite metal member comprising at least two different kinds of metal layers bonded to each other, and
wherein the thermal expansion coefficient of said composite metal member as a whole ($\alpha_M$) is adjusted in a range between the thermal expansion coefficient of said insulating support member ($\alpha_I$) and that of said semiconductor substrate ($\alpha_S$) to reduce deterioration of the solder between the metal member and the insulating support member and between the semiconductor substrate and the metal member during thermal cycles which occur in the semiconductor device during its operation.

11. A semiconductor device according to claim 10, wherein the second major surface of said insulating support member includes a plurality of heat dissipation fins projecting from said second major surface.

12. A semiconductor device according to claim 7 or 11 wherein the metal layers in said composite metal member are bonded directly to one another.

* * * * *